US011327115B2

(12) United States Patent
Chen

(10) Patent No.: US 11,327,115 B2
(45) Date of Patent: May 10, 2022

(54) SCHEME APPLIED IN JTAG TAP APPARATUS, JTAG HOST, AND TARGET SYSTEM CAPABLE OF ACHIEVING DATA VERIFICATION AS WELL AS SAVING ON-CHIP CIRCUIT COSTS

(71) Applicant: Realtek Semiconductor Corp., HsinChu (TW)

(72) Inventor: Yuefeng Chen, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/029,000

(22) Filed: Sep. 22, 2020

(65) Prior Publication Data

US 2021/0190863 A1 Jun. 24, 2021

(30) Foreign Application Priority Data

Dec. 19, 2019 (CN) .......................... 201911319162.0

(51) Int. Cl.
*G01R 31/3185* (2006.01)
*G01R 31/3177* (2006.01)
*G01R 31/317* (2006.01)

(52) U.S. Cl.
CPC . *G01R 31/318597* (2013.01); *G01R 31/3172* (2013.01); *G01R 31/3177* (2013.01); *G01R 31/318555* (2013.01); *G01R 31/318572* (2013.01)

(58) Field of Classification Search
CPC .... G01R 31/318597; G01R 31/318555; G01R 31/318572; G01R 31/3177; G01R 31/3172
See application file for complete search history.

(56) References Cited

U.S. PATENT DOCUMENTS

| 5,768,288 A | * | 6/1998 | Jones | G01R 31/318555 |
| | | | | 714/725 |
| 6,044,025 A | | 3/2000 | Lawman | |
| 6,058,255 A | | 5/2000 | Jordan | |
| 6,134,481 A | * | 10/2000 | Warren | G06F 11/3656 |
| | | | | 700/28 |
| 6,546,505 B1 | | 4/2003 | Swoboda | |
| 6,651,225 B1 | | 11/2003 | Lin | |
| 6,883,109 B2 | | 4/2005 | Erickson | |
| 7,047,467 B1 | | 5/2006 | Khu | |

(Continued)

OTHER PUBLICATIONS

Yao Lu, Yanxu Zhu and Ming Li, "A MBIST controller based on JTAG interface applied in power line chip," 2016 13th IEEE International Conference on Solid-State and Integrated Circuit Technology (ICSICT), 2016, pp. 1404-1406, (Year: 2016).*

*Primary Examiner* — Cynthia Britt
(74) *Attorney, Agent, or Firm* — Winston Hsu

(57) ABSTRACT

A JTAG TAP apparatus coupled between a host and an interface circuit, which is coupled between a memory and the JTAG TAP apparatus, includes first pin, second pin, first data register, and second data register. The first data register stores data shifted in by the host via the first pin, the shifted in data is stored into a specific address of the memory via the interface circuit. The second data register stores read back data from the specific address of the memory via the interface circuit and outputs the read back data to the host via the second pin to make the host compare the shifted in data with the read back data to perform comparison test.

12 Claims, 2 Drawing Sheets

(56) References Cited

U.S. PATENT DOCUMENTS

| | | |
|---|---|---|
| 7,600,166 B1 | 10/2009 | Dunn |
| 8,856,600 B2 | 10/2014 | Zadigian |
| 10,019,546 B1 | 7/2018 | Stoler |
| 2006/0242501 A1* | 10/2006 | Kimelman ..... G01R 31/318572 |
| | | 714/724 |
| 2009/0265594 A1 | 10/2009 | Whetsel |
| 2013/0198578 A1* | 8/2013 | Chandel ................. G11C 29/32 |
| | | 714/727 |

* cited by examiner

SCHEME APPLIED IN JTAG TAP APPARATUS, JTAG HOST, AND TARGET SYSTEM CAPABLE OF ACHIEVING DATA VERIFICATION AS WELL AS SAVING ON-CHIP CIRCUIT COSTS

BACKGROUND OF THE INVENTION

1. Field of the Invention

The invention relates to a Joint Test Action Group (JTAG) test mechanism, and more particularly to a JTAG Test Access Port (TAP) apparatus, a corresponding host, and a target system.

2. Description of the Prior Art

Generally speaking, a conventional method using a Joint Test Action Group (JTAG) scheme to download data into a memory of a target system is to shift in data to a JTAG Test Access Port (TAP) from a JTAG host via a TDI pin of the JTAG interface and then to send a signal to a memory interface or bus interface of the system to make the data in a data register to be written into the memory when the shifted in data meets a data length specified in the data register.

If it is needed to verify whether the data writing of the memory is correct, then the JTAG TAP can read back data and compare the data. However, whether the transmission from the JTAG host to the JTAG TAP is correct or incorrect is not verified. If it is needed to verify whether the transmission from the JTAG host to the JTAG TAP is correct or incorrect, then JTAG TAP for example needs to add and attach CRC verification code (s) to one block of data. Then, the JTAG TAP or the target system calculates the received CRC verification code(s) to perform a comparison upon the verification code (s). It is necessary for this conventional method, which verifies whether data downloading is completely correct, to further add and implement data comparison circuit (s) and CRC verification circuit (s) within the target system. This further increases the circuit costs of the JTAG TAP and difficulty for implementation.

SUMMARY OF THE INVENTION

Therefore one of the objectives of the invention is to provide a JTAG TAP apparatus, a JTAG host, and a corresponding target system, to solve the above-mentioned problem(s).

According to embodiments of the invention, the invention is to provide some simple adjustments and expansions for JTAG TAP circuit (s), to implement data verification as well as saving circuit costs of implementations of CRC chips in the JTAG TAP to verification circuits. This can achieve a timely and fast system response, low costs, low verification error rate of system memory read/write, and a complete verification of the JTAG signal transmission.

According to the embodiments, a JTAG TAP apparatus is disclosed. The JTAG TAP apparatus is to be coupled between a JTAG host and an interface circuit which is coupled between a memory and the JTAG TAP apparatus. The JTAG TAP apparatus comprises a first pin, a second pin, a first data register, and a second data register. The first data register is coupled to the first pin, and is configured for storing data shifted in by the JTAG host via the first pin, the data, which is shifted in, is then passed via the interface circuit and is stored in a specific address of the memory. The second data register is coupled to the second pin, and is configured for storing data read back from the specific address of the memory via the interface circuit, and is configured for outputting the data, which is read back, to the JTAG host via the second pin so as to make the JTAG host compare the shifted in data with the read back data to perform a comparison test.

According to embodiments of the invention, a target system to be coupled to a JTAG host is disclosed and comprises a memory, an interface circuit, and a JTAG TAP apparatus. The interface circuit is coupled to the memory. The JTAG TAP apparatus is to be coupled between the JTAG host and the interface circuit, and the JTAG TAP apparatus comprises a first pin, a second pin, a first data register, and a second data register. The first data register is coupled to the first pin, and is used for storing data shifted in by the JTAG host via the first pin, the shifted in data is then passed through the interface circuit and stored in a specific address of the memory. The second data register is coupled to the second pin, and is used for storing data read back from the specific address of the memory via the interface circuit, and is used for outputting the read back data to the JTAG host via the second pin to make the JTAG host compare the shifted in data with the read back data to perform a comparison test.

According to embodiments of the invention, a JTAG host is disclosed and is to be coupled to a JTAG TAP apparatus which is to be coupled to an interface circuit that is coupled between a memory and the JTAG TAP apparatus. The JTAG host comprises a first pin, a second pin, a data buffer, a first-in-first-out (FIFO) buffer, a read-back buffer, and a comparison circuit unit. The data buffer is used for storing specific data to be transmitted to the JTAG TAP apparatus via the first pin and for pushing and transmitting the specific data to the FIFO buffer. The FIFO buffer is coupled to the data buffer and is used for storing the specific data to be transmitted to the JTAG TAP apparatus. The read-back buffer is used for storing a read back data received by the second pin. The comparison circuit unit is coupled to the FIFO buffer and the read-back buffer, and it is used for comparing the specific data with the read back data to generate an error signal. When the specific data does not match to the read back data, the error signal is asserted; when the specific data matches to the read back data, the error signal is de-asserted.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
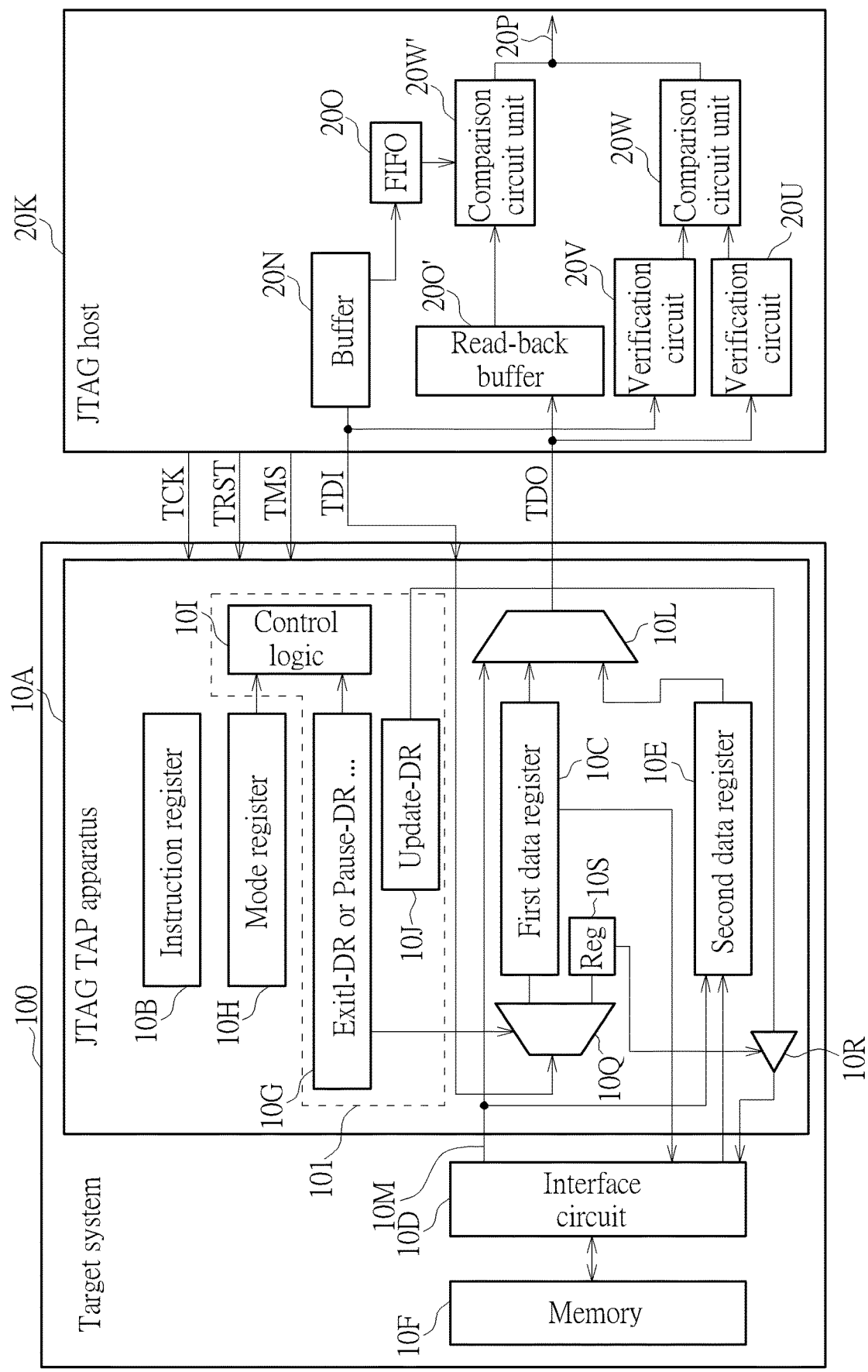
FIG. 1 is a diagram of a JTAG TAP apparatus according to one embodiment of the invention.

Please refer to FIG. 1. FIG. 1 is a diagram of a Joint Test Action Group Test Access Port (JTAG TAP) apparatus 10A according to an embodiment of the invention. As shown in FIG. 1, the target system 100 comprises the JTAG TAP apparatus 10A, an interface circuit 10D such as a memory interface or bus interface, and a memory or buffer 10F. The target system 100 is connected to a JTAG host 20K via at least TCK, TMS, TDI, TDO pins and an optional pin TRST.

TCK pin is a test clock input pin. TMS pin is a test mode select pin. TDI pin is a test data input pin, and TDO pin is a test data output pin. TRST pin is a test reset pin. The JTAG host 20K controls and performs test (s) upon the target system 100 by using the above-mentioned pin (s) to perform read/write test. The JTAG host 20K is used for providing input data for the JTAG TAP apparatus 10A and reading data from the JTAG TAP apparatus 10A for flow control and so on. In practice, the JTAG host 20K can be an arrangement of FPGA or CPLD circuits or can be a system of CPU or MCU carried with GPIO interface. Alternatively, the JTAG host 20K can be a PC carried with PC interface which converts signals to GPIO interface, or can be an adapter system with JTAG interface.

The JTAG TAP apparatus 10A for example comprises a JTAG controller 10I, which for example is consisted of by a state machine circuit (represented by state 10G or 10J) and a joint control logic circuit 10I (but not limited), an instruction register 10B, a mode register 10H, a first data register 10C, a second data register 10E, a multiplexer 10L having three inputs and one output, a de-multiplexer 10Q having one input and two outputs, an output control gate 10R, and a register circuit 10S having one bit. The JTAG host 20K for example comprises a data buffer 20N, a first-in-first-out (FIFO) buffer 20O, a read-back buffer 20O', a comparison circuit unit 20W', a comparison circuit 20W, and verification circuits 20U and 20V. The second data register 10E is used for storing data read back from the memory 10F to shift out the read back data into the JTAG host 20K for data verification. The FIFO buffer 20O is used for storing downloaded data. When the JTAG host 20K sends one data amount, the JTAG host 20K simultaneously also pushes a copy of the identical data amount into the FIFO buffer 20O for only one time. When the output control gate 10R is not enabled, the output control gate 10R in the update-DR state cannot notify the interface circuit 10D of storing new data.

For the target system 100 comprising the JTAG TAP apparatus 10A and memory 10F, the JTAG host 20K can download a data amount to the memory 10F of the target system 100 and read back such data amount from the memory 10F of the target system 100 to verify whether the process of data downloading is correct, i.e. verifying whether the target system 100 correctly operates. In practice, the JTAG host 20K for example sequentially shifts in data to the JTAG TAP apparatus 10A via the TDI pin to store the data into the first data register 10C through the de-multiplexer 10Q. The de-multiplexer 10Q is controlled by the state 10G of the state machine circuit. When the data length of the shifted in data meets a specific data length, the JTAG TAP apparatus 10A controls the state machine circuit entering an update-DR state 10J. In the update-DR state 10J, the JTAG TAP apparatus 10A sends a specific signal to the interface circuit 10D of the target system 100 wherein the interface circuit 10D for example is OCP, AMBA or WINBOND interface circuit (but not limited). Then, the interface circuit 10D obtains or gets data stored in the first data register 10C and then writes the obtained data into the memory 10F. The data reading process is activated after the above-mentioned data writing process is completed. In the data reading process, the data mentioned above is read back from the memory 10F via the interface circuit 10D and then is stored into the second data register 10E. Then, the read back data is transmitted through the multiplexer 10L and TDO pin to synchronously and sequentially shift out the read back data to the JTAG host 20K. The multiplexer 10L is controlled by the state machine circuit (e.g. state 10G) and the joint control logic 10I, i.e. controlled by the JTAG controller 101. Then, the JTAG host 20K directly compares its sent data with its received data to determine whether the received data matches to the sent data to verify the operation of the target system 100, to thereby implement the verification of the whole data transmission path and read/write test of the memory 10F wherein the data transmission path comprises a circuit path from the JTAG TAP apparatus 10A within the target system 100 to the memory 10F and a circuit path from the JTAG host 20K to the JTAG TAP apparatus 10A of the target system 100.

In the embodiments of the invention, the on-chip circuit verification costs can be saved as well as it is unnecessary to further provide and add the resources of register(s) with the storage of a block data level in the JTAG TAP apparatus 10A. Also, the problems that the on-chip verification operation cannot be used to verify whether the JTAG chain correctly works can be solved.

In practice, the JTAG host 20K sequentially shifts in data into the first data register 10C of the JTAG TAP apparatus 10A via the TDI pin. After the data length of data in the first data register 10C meets a specific data length such as 32 bits (but not limited), the JTAG TAP apparatus 10A enters the update-DR state 10J. In the update-DR state 10J, the JTAG TAP apparatus 10A can send a specific signal to the interface circuit 10D wherein the interface circuit 10D for example is implemented by using a memory controller interface or a bus interface. Then, the interface circuit 10D reads out a data amount of 32 bits stored in the first data register 10C, and parallel writes the data amount of 32 bits into a particular address in the memory 10F of the target system 100. When data writing is completed, the memory 10F responds and sends a specific signal to the interface circuit 10D to request/ask the interface circuit 10D to read back the data amount of 32 bits from the particular address of the memory 10F. After reading out the data amount of 32 bits, the interface circuit 10D stores the data amount of 32 bits into the second data register 10E and then the data amount of 32 bits are sequentially shifted out (i.e. one bit by one bit) to the JTA host 20K via the TDO pin. The operation of shifting out data can be performed to sequentially shift out the data amount of 32 bits to the JTAG host 20K simultaneously when the JTAG host 20K sequentially shifts in one other data amount into the JTAG TAP apparatus 10A. Alternatively, in other embodiments, the data amount of 32 bits may be read back by the JTAG host 20K from the JTAG TAP apparatus 10A after the JTAG host 20K has stopped shifting in one other data amount into the JTAG TAP apparatus 10A.

For the JTAG host 20K, the JTAG host 20K can directly compare the sent data (e.g. one data amount of 32 bits) with the received data (i.e. one data amount of 32 bits sent from the JTAG TAP apparatus 10A) to determine whether the sent data matches the received data so as to implement the verification of the whole data link path and read/write/access of the memory 10F. If data is matched, then the verification result is pass. Otherwise, if data is not matched, then the verification result is fail.

In addition, the JTAG host 20K can use at least two schemes to implement data verification. For example, the JTAG host 20K can employ an operation of directly comparing data to implement data verification. The JTAG host 20K comprises a data buffer 20N and a comparison circuit. In a first embodiment, the comparison circuit for example comprises the first-in-first-out (FIFO) buffer 20O, the read-back buffer 20O', and the comparison circuit unit 20W'. In this embodiment, the verification circuits 20V, 20U, and the comparison circuit unit 20W are optional. The data buffer 20N is used to store multiple data amounts, which are to be sequentially shifted out from the JTAG host 20K to the JTAG TAP apparatus 10A, e.g. multiple data amounts each having 32 bits (but not limited). When each time one data amount of 32 bits is shifted out from the JTAG host 20K to the JTAG TAP apparatus 10A, the JTAG host 20K simultaneously stores the same data amount of 32 bits into the FIFO buffer 20O. When the JTAG host 20K waits and receives one valid data amount of 32 bits read back from the TDO pin, the bits of the read back data amount are sequentially stored into the read-back buffer 20O'. Then, the comparison circuit unit 20W' is arranged to compare the bits of the read back data amount with 32 bits of one data amount at the output terminal of the FIFO buffer 20O. If data is matched or equal, then the comparison circuit unit 20W' is arranged to control the FIFO buffer 20O sending or popping such data amount. Instead, if data is not matched or not equal, then the comparison circuit unit 20W' is arranged to send an error signal 20P to indicate an error or indicate that data is not matched. In this example, the error signal 20P is asserted to indicate an error or indicate that data is not matched. Accordingly, the scheme provided in the embodiments of the invention has a shortest response time to handle an occurrence of data errors and thus can timely find or recognize data errors to report and implement a timely error processing. In addition, since in an embodiment the data writing and data reading may be independent and the speed of data writing may be faster than that of data reading, in practice the data length of the FIFO buffer 20O can be adjusted in accordance with the time delay between the data writing and data reading. For example, when the speed difference of data writing compared to data reading is larger, more memory circuits are needed to implement the FIFO buffer 20O.

In addition, in a second embodiment, the comparison circuit for example may comprise the verification circuits 20V and 20U such as CRC verification circuits and the comparison circuit unit 20W; the above-mentioned FIFO buffer 20O, read-back buffer 20O', and comparison circuit unit 20W' are not needed/necessary. The JTAG host 20K can implement CRC verification and/or other type data verifications upon written data. The FIFO buffer 20O, read-back buffer 20O', and comparison circuit unit 20W' are optional. The verification circuit 20V is used to store at least one data amount, needed to be sent, transmitted by/from an upper circuit such as the buffer 20N and is used to perform CRC or other type data verifications upon the at least one transmitted data amount to generate CRC verification code (s) or other type verification codes. When at least one data amount is read back, the verification circuit 20U is used to perform CRC or other type data verifications upon the at least one read back data amount to generate CRC verification code (s) or other type verification codes. Then, the comparison circuit unit 20W is used to compare the verification result of the transmitted data with the verification result of the received data to generate the error signal 20P. If the two verification results are not matched or not identical, then the error signal 20P is asserted. Instead, if the two verification results are matched or identical, then the error signal 20P is de-asserted.

In the above two embodiments, if the error signal 20P is asserted (i.e. an error is found after verification), then the JTAG host 20K starts to perform subsequent processing operation(s) such as retransmitting data, stopping data transmission, or notifying a upper software/hardware unit of such event so that the upper software/hardware unit can handle such event.

Further, for the JTAG TAP apparatus 10A, the mode register 10H can be used with the joint control logic 10I to control the multiplexer 10L, to make the output of the multiplexer 10L be switched from the output of the first data register 10C to the output of the second data register 10E, so that the second data register 10E can be connected to the TDO pin to perform an operation of sequentially shifting out data.

Further, in two embodiments of the invention, the operation of shifting in data and the operation of shifting out data are performed simultaneously. In a first embodiment, when is the read back data is valid can be predicted, and the JTAG host 20K is capable of using a counter to calculate the number of the signal's rising edges occurring at the TCK pin and does not sequentially shift in data via the TDI pin until the data becomes valid. When the data amount of shifted in data meets a data length of one data amount unit specified in the data register, the JTAG host 20K stores such data amount into the data register. Alternatively, the JTAG host 20K may calculate CRC verifications or other verifications. When the data is not valid, the JTAG host 20K ignores such data. Further, in a second embodiment, when is the read back data amount is valid cannot be predicted, and a flow control scheme may be employed additionally. The flow control scheme comprises multiple control methods. For example, in one embodiment, after data, which meets one data amount or burst data amounts each corresponding to a data length specified in the data register, has been downloaded to the target system 100, the flow control scheme makes the JTAG host 20K exit the shift-DR state to read data of a particular state register. If the read data is ready (the data for example may be data having multiple data lengths and stored into the FIFO buffer 20O), then the low control scheme determines that it is needed to read out data at this timing and simultaneously allows the second data register 10E starting to sequentially shift out data. Then, the JTAG host 20K starts to select the first data register 10C to enter the shift-DR state to send data and receive the read back data simultaneously.

Figure 2:
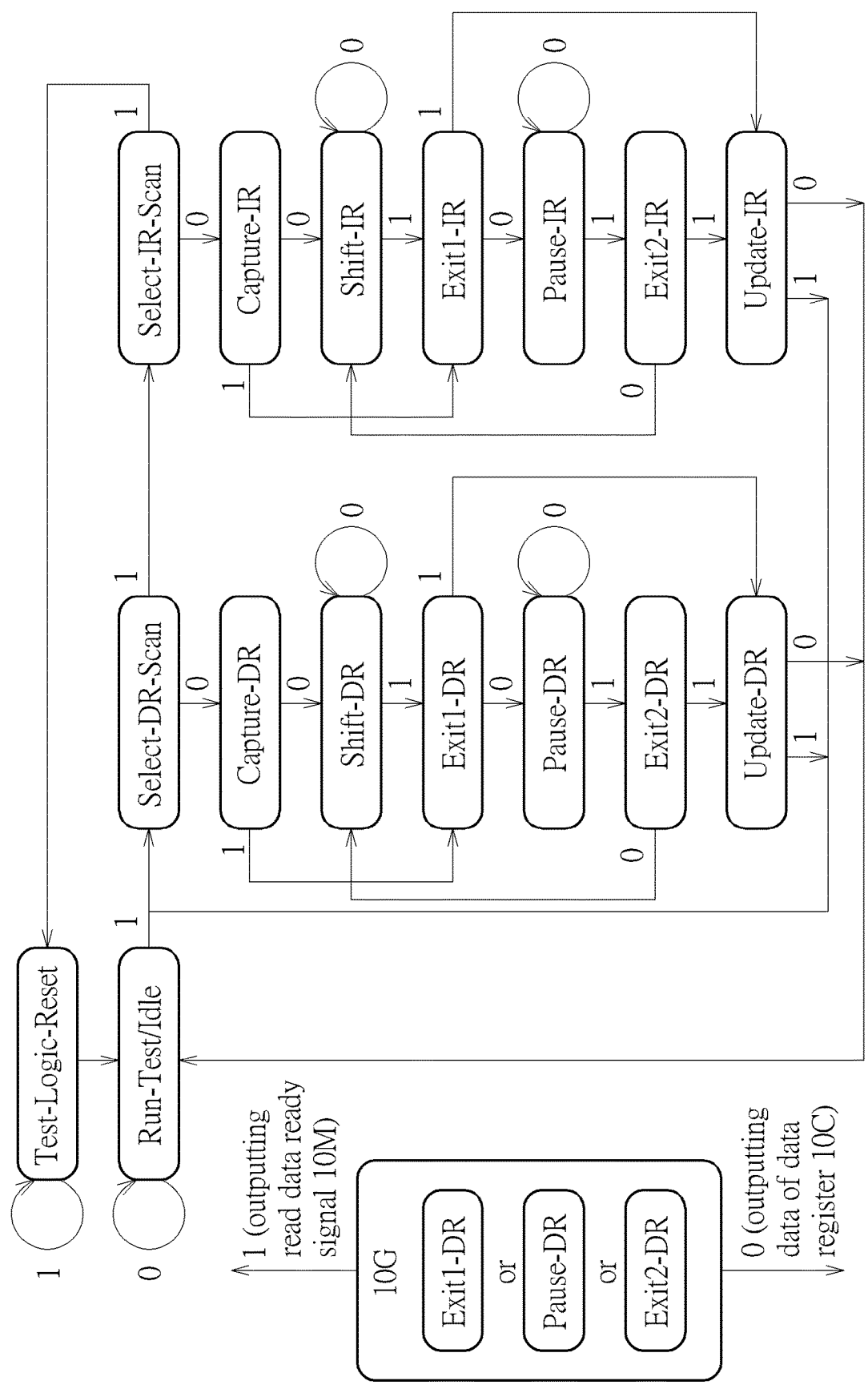
FIG. 2 is a diagram of the state transition of the JTAG TAP apparatus as shown in FIG. 1.

Further in one embodiment, after each time one data amount having one data length specified in a data register has been transmitted, the working state of the JTAG controller 101 for example exits the shift-DR state and goes through a state switching process of shift-DR->exit1-DR->update-DR->select-DR-scan->capture-DR->shift-DR, and then enters the shift-DR state again. Alternatively, in another embodiment, the working state of the JTAG controller 101 may go through another state switching process of shift-DR->exit1-DR->pause-DR->exit2-DR->shift-DR. In this situation, the JTAG controller 101 does not go through the update-DR state, and TCK pin is not used. Exit1-DR, Exit2-DR, or pause-DR state can be used to replace the update-DR state to trigger the data writing or reading of the memory 10F. Additionally, in one embodiment, if the JTAG controller 101 does not need to go through the update-DR state each time when data is updated, then the JTAG controller 101 can select a particular state in the state 10G, i.e. one among Exit1-DR, pause-DR, and Exit2-DR states; the selected state is not identical to the currently used state of the state 10G. The state transitions of working state of the JTAG controller 101 can be referenced according to FIG. 2.

When the working state is in the state 10G (Exit1-DR, Pause-DR, or Exit2-DR state), the output at the TDO pin can be switched from the mode register 10H with joint control logic 10I to a read data ready signal 10M generated by the interface circuit 10D such as a memory interface or bus interface. The operation of joint control logic 10I for example may comprise: (1) when a mode bit of the mode register 10H is equal to '1' and the state transition of the state 10G (i.e. Exit1-DR, Pause-DR, or Exit2-DR) of the JTAG TAP apparatus 10A is equal to '1', the joint control logic 10I is arranged to control the multiplexer 10L outputting the signal 10M to make the TDO pin output the signal 10M read back from the memory interface or the bus interface; or, (2) when the mode bit of the mode register 10H is equal to '0' or '1' and the state transistor of the state 10G of the JTAG TAP apparatus 10A is equal to '0', the joint control logic 10I is arranged to control the multiplexer 10L outputting the data of the first data register 10C to make the TDO pin still output the data of the first data register 10C.

Additionally, the JTAG host 20K has the capability of identifying which one of Exit1-DR, Pause-DR, Exit2-DR, or shift-DR state is the state of TDO pin, and can store the signal read via the TDO pin, i.e. signal 10M, at the Exit1-DR, Pause-DR, or Exit2-DR state into its internal register and does not perform data comparison and does not output the data of FIFO buffer 20O when the read data is invalid. The signal until it becomes valid is not used as a control signal for controlling the operation of writing the read back data into the second data register 10E, and will be automatically become invalid after the data has been written. In this situation, it can be determined that the asynchronous signal processing has been completed.

Since the timing of the read back data outputted via the TDO pin is later than the timing of the data inputted via the TDI pin and shifting in data and shifting out data are simultaneously performed and inseparable, thus it is needed to control the TDI pin not to continue inputting data after one block of data amounts is inputted; continue inputting data amounts may cause an erroneous problem of too much input data. In this embodiment of the invention, two control methods can be applied to solve the problem. In a first embodiment, the JTAG TAP apparatus 10A may further comprise a block length register (not shown in FIG. 1). Before a block of multiple data amounts is completely inputted, the JTAG TAP apparatus 10A is arranged to switch to control the instruction register 10B to fill with a block data length into the instruction register 10B and then to switch back to the first data register 10C to start shifting in data. Each time when a data amount having one data length is inputted, the block data length becomes the block data length minus one. When the block data length becomes zero, a data amount to be shifted in will be discarded and not written into the memory 10F so as to avoid the problem of too much input data. The TDO pin can be used to continue outputting the read back data until all data bits are outputted and compared. The JTAG host 20K in this situation is arranged to control the TMS pin to switch the working state of the JTAG controller 101 to make the JTAG controller 101 exit the shift-DR state and go back to the IDLE state.

Ina second embodiment, the block length register is not needed to be within the JTAG TAP apparatus 10A. After all data is inputted, the JTAG host 20K can use the TMS pin to control the working state of the JTAG controller 101 entering the state Exit1-DR, Pause-DR, or Exit2-DR. A specific signal is inputted via the TDI pin to the register having one bit, i.e. 10S, to indicate that subsequent data following such data is invalid. The register 10S is used to store the specific signal updated. When the data amounts meet the block data length, the JTAG host 20K is arranged to input and enable the specific signal (the specific signal by default is not enabled) to make the JTAG TAP apparatus 10A not update invalid data into the memory 10F when the working state of JTAG controller 101 is in the state 10G. The JTAG TAP apparatus 10A does not write the shifted in data into the memory 10F after receiving the shifted in data. Before starting a new data transmission process, the JTAG host 20K is arranged to clear the signal in the register 10S when the working state of the JTAG controller 101 is in the state 10G. In one embodiment, the JTAG host 20K may clear the signal according to the empty state of the FIFO buffer 20O or the number of data amounts verified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Test Access Port (TAP) apparatus, to be coupled between a test host and an interface circuit which is coupled between a memory and the TAP apparatus, and the TAP apparatus comprises:
    a first pin;
    a second pin;
    a first data register, coupled to the first pin, configured for storing data shifted in by the test host via the first pin, the data, which is shifted in, is then passed via the interface circuit and is stored in a specific address of the memory; and
    a second data register, coupled to the second pin, configured for storing data read back from the specific address of the memory via the interface circuit, and configured for outputting the data, which is read back, to the test host via the second pin so as to make the test host compare the shifted in data with the read back data to perform a comparison test.

2. The apparatus of claim 1, wherein the first pin is a test data input pin, and the second pin is a test data output pin.

3. The apparatus of claim 1, further comprising:
    a multiplexer, having a first input terminal, a second input terminal, a third input terminal, and an output terminal, the first input terminal being coupled to a signal outputted by the interface circuit, the second input terminal being coupled to an output of the first data register, the third input terminal being coupled to an output the second data register; and
    a test controller, coupled to the multiplexer, configure for controlling the multiplexer selectively outputting the signal outputted by the interface circuit, the output of the first data register, or the output of the second data register to the second pin.

4. The apparatus of claim 3, wherein when a working state of the TAP apparatus is at one of Exit1-DR, Pause-DR, and Exit2-DR states, the test controller is arranged to control the multiplexer to output a read data ready signal outputted by the interface circuit to the second pin.

5. The apparatus of claim 4, further comprising:
    a mode register, coupled to the test controller;
    wherein when a mode bit of the mode register is equal to '1', the test controller is at one state of Exit1-DR, Pause-DR, or Exit2-DR state, and a state transition is equal to '1', the multiplexer is arranged to output the read data ready signal outputted by the interface circuit to the second pin.

6. The apparatus of claim 5, wherein when the test controller is at the one state of Exit1-DR, Pause-DR, or Exit2-DR state and the state transition is equal to '0', the multiplexer is arranged to output the output of the first data register to the second pin.

7. A target system to be coupled to a test host, comprising:
a memory; an interface circuit, coupled to the memory; and
a Test Access Port (TAP) apparatus, to be coupled between the test host and the interface circuit, the TAP apparatus comprising:
a first pin;
a second pin;
a first data register, coupled to the first pin, for storing data shifted in by the test host via the first pin, the shifted in data is then passed through the interface circuit and stored in a specific address of the memory; and
a second data register, coupled to the second pin, for storing data read back from the specific address of the memory via the interface circuit, and for outputting the read back data to the test host via the second pin to make the test host compare the shifted in data with the read back data to perform a comparison test.

8. The target system of claim 7, wherein the first pin is a test data input pin, and the second pin is a test data output pin.

9. The target system of claim 7, wherein the TAP apparatus further comprises:
a multiplexer, having a first input terminal, a second input terminal, a third input terminal, and an output terminal, the first input terminal being coupled to a signal outputted by the interface circuit, the second input terminal being coupled to an output of the first data register, the third input terminal being coupled to an output of the second data register; and
a test controller, coupled to the multiplexer, for controlling the multiplexer selectively outputting the signal outputted by the interface circuit, the output of the first data register, or the output of the second data register to the second pin.

10. The target system of claim 9, wherein when a working state of the TAP apparatus is at one of Exit1-DR, Pause-DR, and Exit2-DR state, the test controller is arranged to control the multiplexer to output a read data ready signal outputted by the interface circuit to the second pin.

11. The target system of claim 10, wherein the TAP apparatus further comprises:
a mode register, coupled to the test controller;
wherein when the a mode bit of the mode register is equal to '1', the test controller is at a state of Exit1-DR, Pause-DR, or Exit2-DR, and a state transition is equal to '1', the multiplexer is arranged to output the read data ready signal outputted by the interface circuit to the second pin.

12. The target system of claim 11, wherein when the test controller is at the state of Exit1-DR, Pause-DR, or Exit2-DR and the state transition is equal to '0', the multiplexer is arranged to output the output of the first data register to the second pin.

* * * * *